(12) United States Patent
Yoon

(10) Patent No.: US 12,199,184 B2
(45) Date of Patent: Jan. 14, 2025

(54) SEMICONDUCTOR DEVICES HAVING A MULTI-OXIDE SEMICONDUCTOR CHANNEL LAYER AND METHODS OF MANUFACTURING THE SEMICONDUCTOR DEVICES

(71) Applicant: SK hynix Inc., Gyeonggi-do (KR)

(72) Inventor: Young Gwang Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 373 days.

(21) Appl. No.: 17/714,517

(22) Filed: Apr. 6, 2022

(65) Prior Publication Data
US 2023/0127755 A1 Apr. 27, 2023

(30) Foreign Application Priority Data
Oct. 27, 2021 (KR) .................... 10-2021-0144316

(51) Int. Cl.
| | | |
|---|---|---|
| *H01L 29/786* | (2006.01) | |
| *H01L 21/8234* | (2006.01) | |
| *H01L 27/12* | (2006.01) | |
| *H01L 29/417* | (2006.01) | |
| *H01L 29/66* | (2006.01) | |
| *H01L 29/78* | (2006.01) | |

(52) U.S. Cl.
CPC .. *H01L 29/7869* (2013.01); *H01L 21/823431* (2013.01); *H01L 27/1225* (2013.01); *H01L 29/41791* (2013.01); *H01L 29/66795* (2013.01); *H01L 29/785* (2013.01)

(58) Field of Classification Search
None
See application file for complete search history.

(56) References Cited

U.S. PATENT DOCUMENTS 9,093,541 B2   7/2015  Kitakado et al.
2018/0182831 A1  6/2018  Ahmed et al.

*Primary Examiner* — Anthony Ho
(74) *Attorney, Agent, or Firm* — IP & T GROUP LLP

(57) ABSTRACT

A semiconductor device include a substrate having a gate area and a contact area, a buried insulating layer formed over the substrate, a fin-type insulating pattern formed over the buried insulating layer and extending in a first horizontal direction, a lower metal layer covering an upper surface and side surfaces of the fin-type insulating pattern in the contact pattern, a channel layer covering an upper surface and side surfaces of the lower metal layer in the contact area and covering the upper surface and the side surfaces of the fin-type insulating pattern in the gate area, a gate pattern disposed over the channel layer in the gate area and extending in a second direction, and a source/drain contact pattern disposed over the channel layer in the contact area. The lower metal layer includes a Ti-based metal. The channel layer includes an oxide semiconductor material.

23 Claims, 15 Drawing Sheets

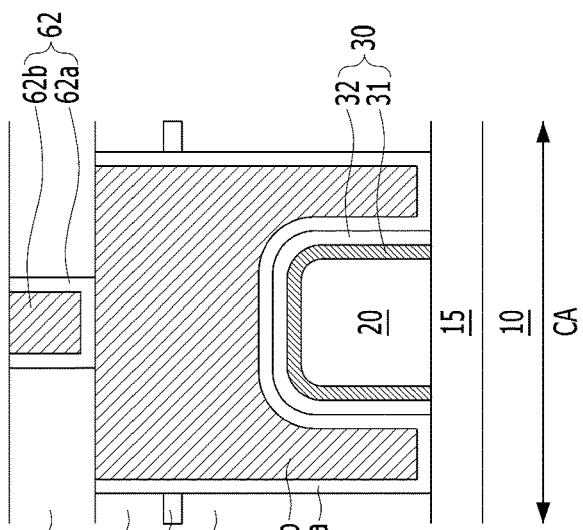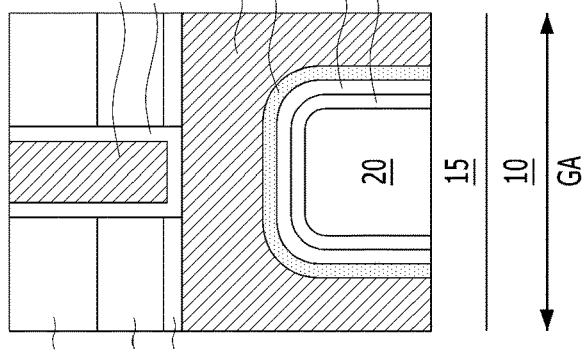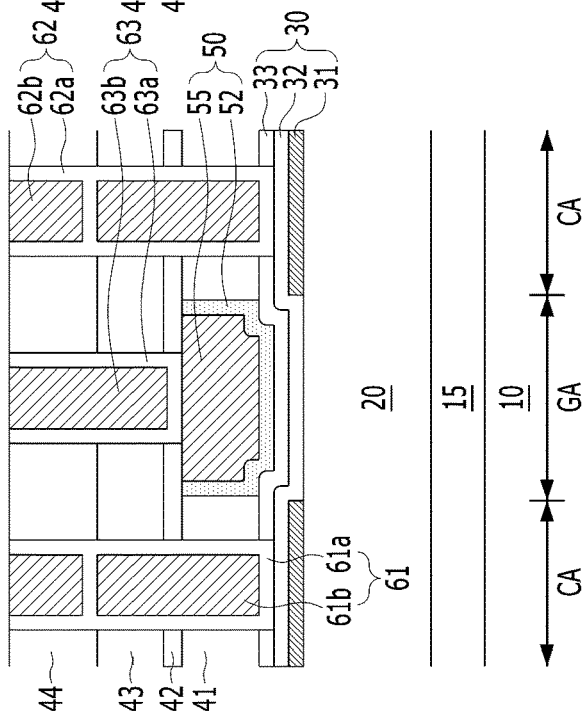

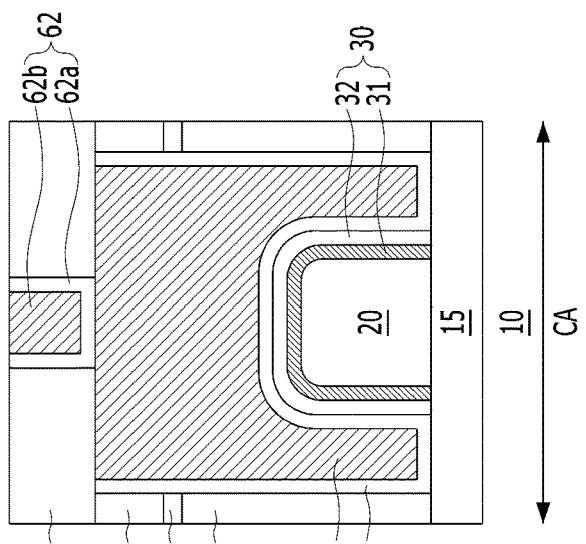
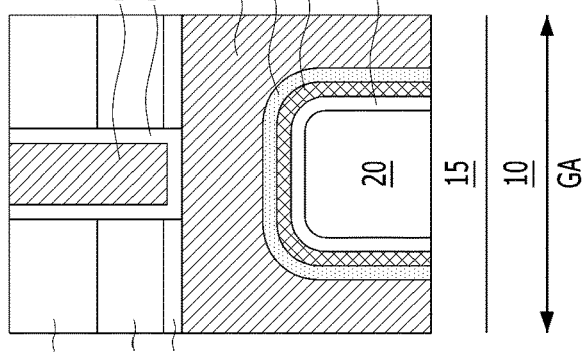
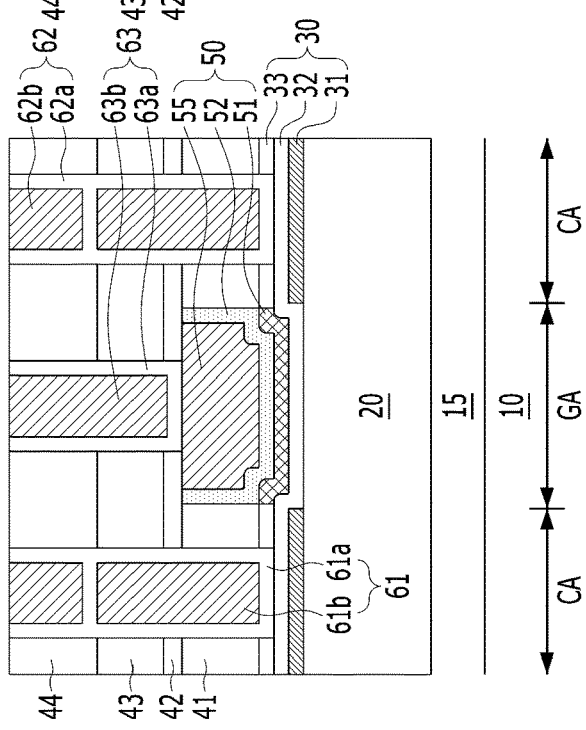

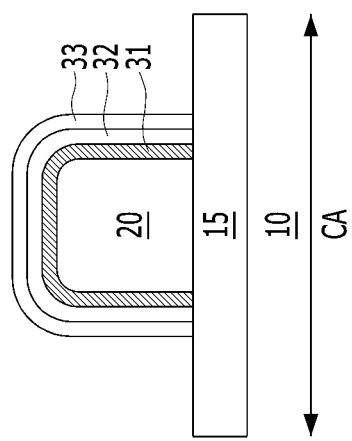
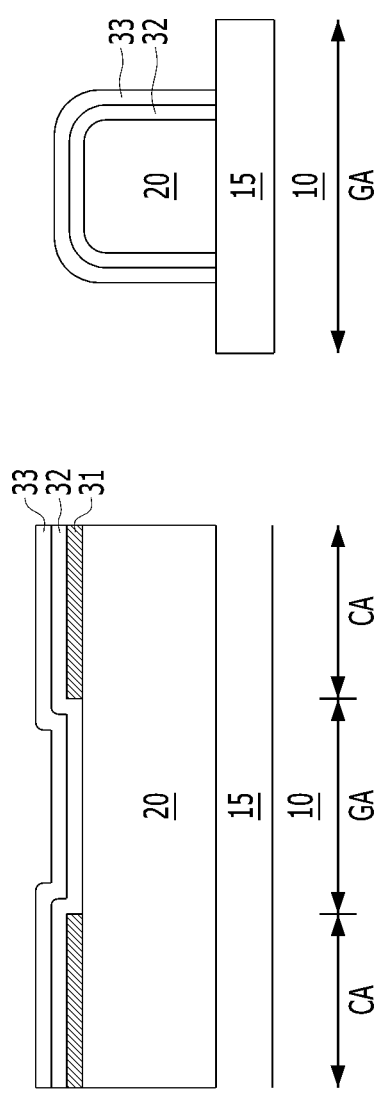

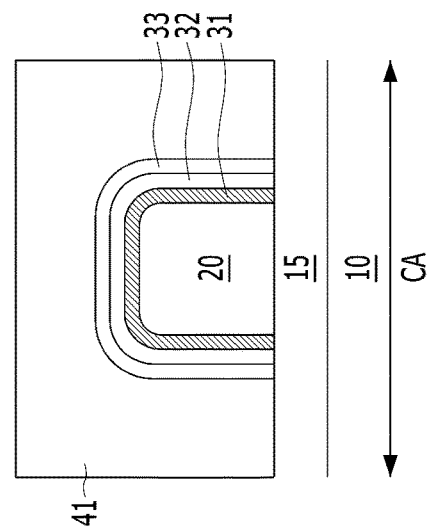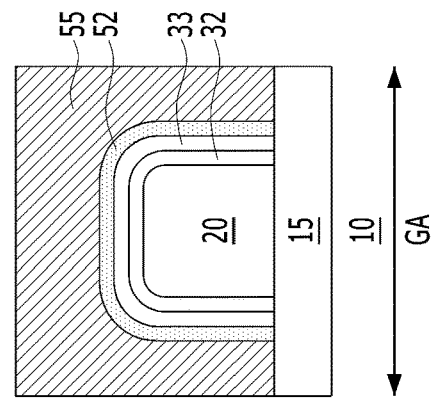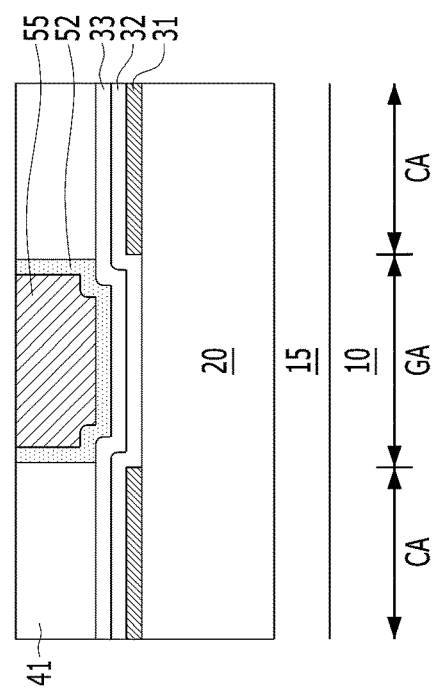

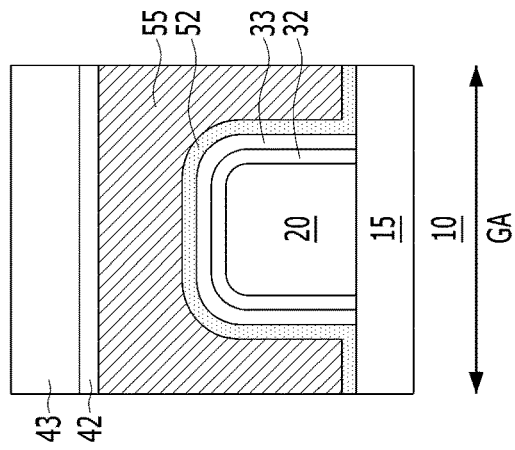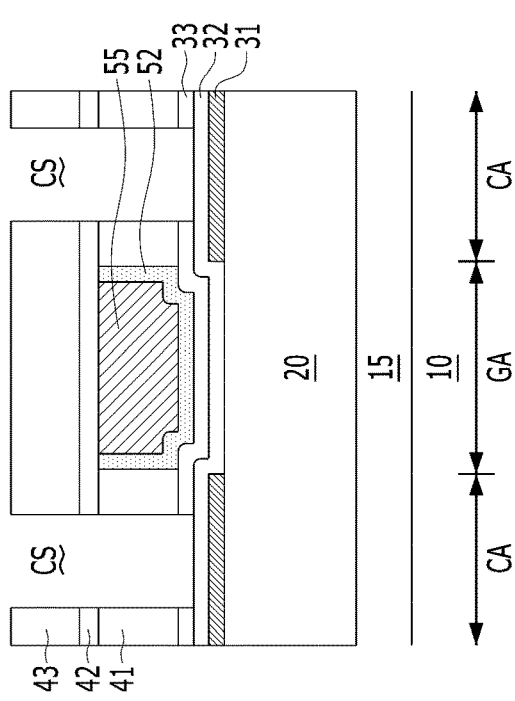

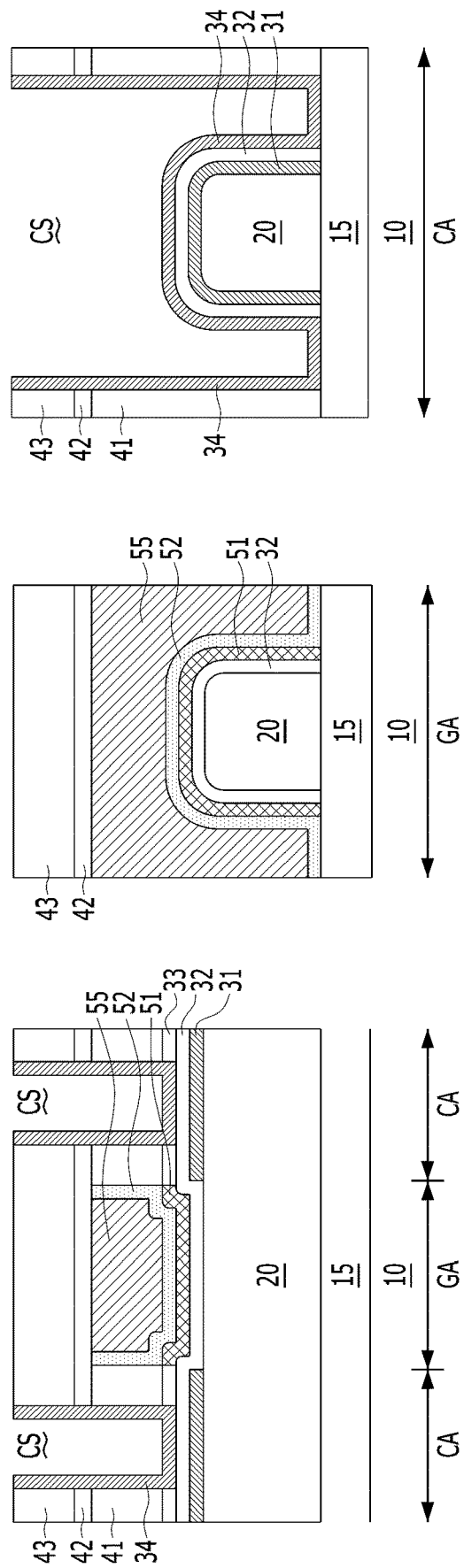

SEMICONDUCTOR DEVICES HAVING A MULTI-OXIDE SEMICONDUCTOR CHANNEL LAYER AND METHODS OF MANUFACTURING THE SEMICONDUCTOR DEVICES

CROSS-REFERENCE TO RELATED APPLICATIONS

The present application claims priority to Korean Patent Application No. 10-2021-0144316, filed on Oct. 27, 2021, which is herein incorporated by reference in its entirety.

BACKGROUND

1. Field

Embodiments of the present disclosure provide semiconductor devices having a multi oxide semiconductor channel layer and methods of manufacturing the semiconductor devices.

2. Description of the Related Art

An oxide semiconductor generally has lower carrier mobility than silicon bulk. Accordingly, the off-characteristics of a transistor having an oxide semiconductor channel can be improved. However, due to the low carrier mobility, the transistor may have lower driving ability and higher resistance. Accordingly, it may be difficult to apply such transistor to high-integration and high-performance semiconductor devices.

SUMMARY

Various embodiments of the present invention disclosure provide a transistor having a multi oxide semiconductor channel, and a semiconductor device including the transistor.

Various embodiments of the present disclosure provide a method of manufacturing a transistor having a multi oxide semiconductor channel, and a method of manufacturing a semiconductor device including the transistor.

A semiconductor device according to an embodiment of the disclosure include a substrate having a gate area and a contact area, a buried insulating layer formed over the substrate, a fin-type insulating pattern formed over the buried insulating layer and extending in a first horizontal direction, a lower metal layer covering an upper surface and side surfaces of the fin-type insulating pattern in the contact pattern, a channel layer covering an upper surface and side surfaces of the lower metal layer in the contact area and covering the upper surface and the side surfaces of the fin-type insulating pattern in the gate area, a gate pattern disposed over the channel layer in the gate area and extending in a second direction, and a source/drain contact pattern disposed over the channel layer in the contact area. The lower metal layer includes a Ti-based metal. The channel layer includes an oxide semiconductor material.

A semiconductor device according to an embodiment of the disclosure includes a substrate having a gate area and a contact area, a fin-type insulating pattern extending in a first horizontal direction over the substrate, a lower Ti-based metal layer covering an upper surface and side surfaces of the fin-type insulating pattern in the contact area, an oxide semiconductor layer covering an upper surface and side surfaces of the lower Ti-based metal layer in the contact area and covering the upper surface and the side surfaces of the fin-type insulating pattern in the gate area, a buffer insulating layer over the oxide semiconductor layer, a gate pattern extending in a second horizontal direction over the oxide semiconductor layer in the gate area, and a source/drain contact pattern over the oxide semiconductor layer in the contact area.

A semiconductor device according to embodiment of the disclosure includes a substrate having a gate area and a contact area, a buried insulating layer over the substrate, a fin-type insulating pattern over the buried insulating layer, the fin-type insulating pattern extending in a first horizontal direction and formed in the gate area and the contact area, a lower Ti-based metal layer over an upper surface and side surfaces of the fin-type insulating pattern in the contact area, a channel layer formed over the fin-type insulating pattern in the gate area and formed over the lower Ti-based metal layer in the contact area, a gate electrode extending in a second horizontal direction and formed over the channel layer in the gate area, an upper Ti-based metal layer over the channel layer in the contact area, and a source/drain contact pattern over the upper Ti-based metal layer in the contact area.

A method of manufacturing a semiconductor device according to an embodiment of disclosure includes providing a substrate having a gate area and a contact area, forming a fin-type insulating pattern extending in a first horizontal direction over the substrate, forming a lower Ti-based metal layer over an upper surface and side surfaces of the fin-type insulating pattern in the contact area, forming an oxide semiconductor layer over an upper surface and side surfaces of the lower Ti-based metal layer and the fin-type insulating pattern, forming a sacrificial gate electrode extending in a second horizontal direction over the oxide semiconductor layer in the gate area, forming a lower interlayer insulating layer over the oxide semiconductor layer in the contact area, forming a gate trench in the gate area by removing the sacrificial gate electrode, forming a gate electrode in the gate trench, forming a contact slit exposing the channel layer in the contact area, and forming a source/drain contact pattern over the channel layer exposed in the contact slit.

BRIEF DESCRIPTION OF THE DRAWINGS

FIGS. 2A to 2C are longitudinal sectional views taken along lines I-I', II-II', and III-III' of a semiconductor device according to an embodiment of the present disclosure illustrated in FIG. 1.

FIGS. 3A to 3C are longitudinal sectional views taken along the lines I-I', II-II', and III-III' of a semiconductor device according to an embodiment of the present disclosure illustrated in FIG. 1, respectively.

FIGS. 5A to 12C are longitudinal sectional views illustrating a method of manufacturing a semiconductor device according to an embodiment of the present disclosure.

FIGS. 15A to 15C are longitudinal sectional views illustrating a method of manufacturing a semiconductor device according to an embodiment of the present disclosure.

DETAILED DESCRIPTION

Figure 1:
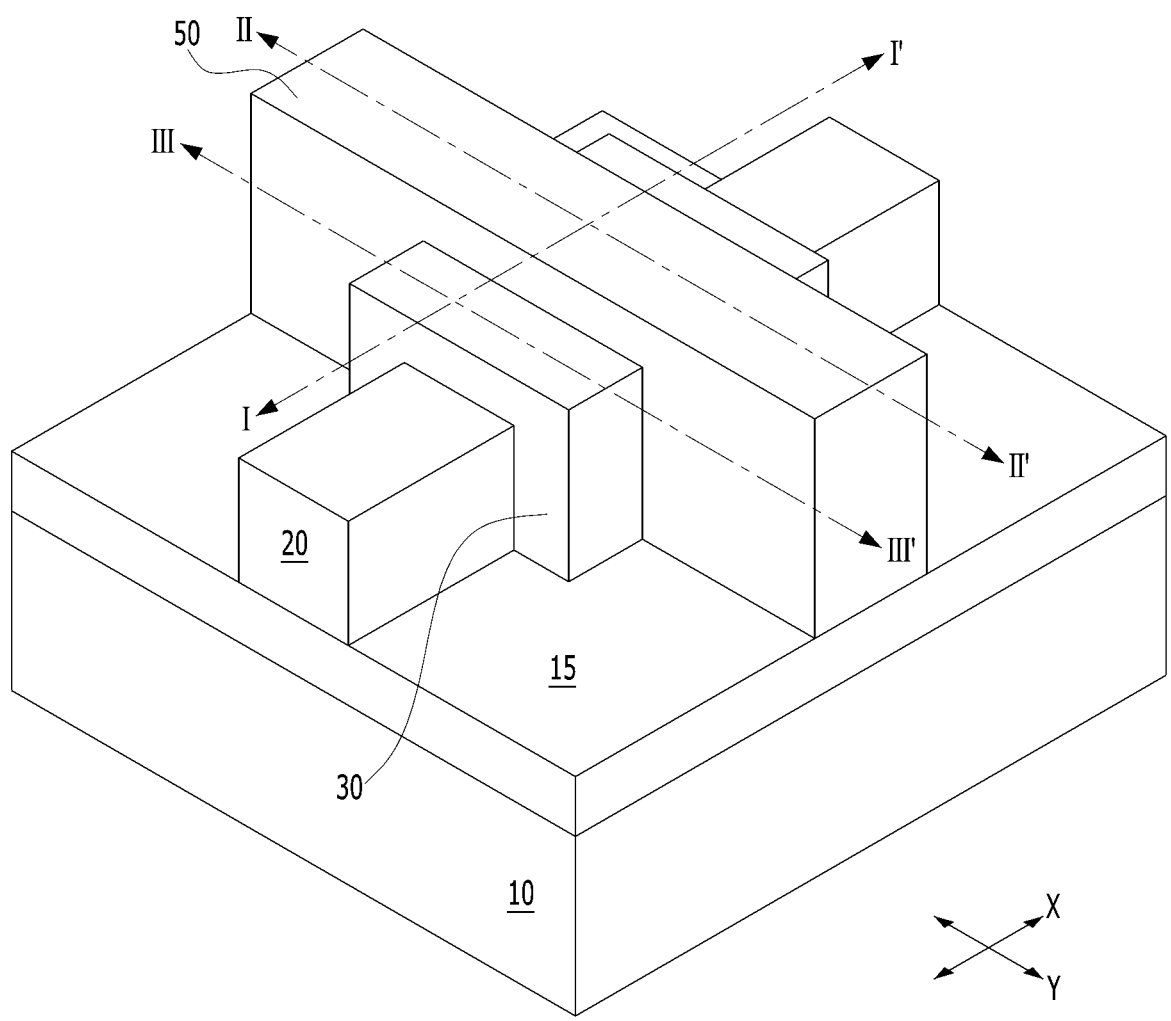
FIG. 1 is a perspective view schematically illustrating a semiconductor device according to an embodiment of the present disclosure.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

Other expressions that explain the relationship between elements, such as "between", "directly between", "adjacent to" or "directly adjacent to" should be construed in the same way.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer with no intervening layers but also to a case where intervening layers are formed between the first and second layers. It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

FIG. 1 is a perspective view schematically illustrating a semiconductor device according to an embodiment of the present disclosure. Referring to FIG. 1, a semiconductor device according to an embodiment of the present disclosure may include a buried insulating layer 15 entirely formed over a substrate 10, a fin-type insulating pattern 20 formed over the buried insulating pattern 15 to have a line shape extending in a first horizontal direction X over the buried insulating layer 15, a source/drain pattern 30 covering a portion of an upper surface and a portion of a side surface of the fin-type insulating pattern 20, and a gate pattern 50 covering a portion of an upper surface and a portion of a side surface of the fin-type insulating pattern 20 over the buried insulating layer 15 to extend in a second horizontal direction Y. The first horizontal direction X and the second horizontal direction Y may be perpendicular to each other. In an embodiment, the source/drain pattern 30 and the gate pattern 50 may each have a Greek pi shape "π" cross section (cut at a right angle to the first horizontal direction X) with the bottom surface of the legs of the pi touching the top surface of the buried insulating layer 15.

FIGS. 2A to 2C are longitudinal sectional views taken along lines I-I', II-II', and III-III' of a semiconductor device according to an embodiment of the present disclosure illustrated in FIG. 1. Referring to FIGS. 2A to 2C, a semiconductor device according to the embodiment of the present disclosure may include a buried insulating layer 15, a fin-type insulating pattern 20, a source/drain pattern 30, a gate pattern 50, a lower source/drain contact pattern 61, an upper source/drain contact pattern 62, a gate contact pattern 63, and insulating layers 41, 42, 43, and 44 over a substrate 10.

The substrate 10 may include a semiconductor layer such as a silicon wafer. In some embodiments, the substrate 10 may include one of a compound semiconductor layer, an epitaxially grown silicon layer, silicon-on-insulator (SOI), or other semiconducting material layers. The substrate 10 may have a gate area GA and a contact area CA. The gate pattern 50 and the gate contact pattern 63 may be formed in the gate area GA. The source/drain pattern 30, the lower source/drain contact pattern 61, and the upper source/drain contact pattern 62 may be formed in the contact area CA.

The buried insulating layer 15 may be formed over the substrate 10 in its entirety, meaning that the entire bottom surface of the buried insulating layer 15 may be in contact with the top surface of the substrate 10. The buried insulating layer 15 may include at least one insulating material such as silicon oxide ($SiO_2$), silicon oxy-carbide (SiOC), and silicon nitride (SiN).

The fin-type insulating pattern 20 may have a fin shape or a bar shape that protrudes from an upper surface of the buried insulating layer 15 and extends in the first horizontal direction X. The fin-type insulating pattern 20 may include an insulating material such as silicon oxide ($SiO_2$).

The source/drain pattern 30 may cover an upper surface and side surfaces of the fin-type insulating pattern 20 in the contact area CA. The source/drain pattern 30 may include a lower metal layer 31, a channel layer 32, and a buffer insulating layer 33. The lower metal layer 31 may be directly formed over the upper and side surfaces of the fin-type insulating pattern 20. The lower metal layer 31 may include a Ti (titanium)-based metal. For example, the lower metal layer 31 may include at least one of titanium (Ti), titanium nitride (TiN), titanium carbide (TiC), titanium aluminum (TiAl), and titanium aluminum nitride (TiAlN). In an embodiment, the lower metal layer 31 may include one of titanium carbide (TiC) or titanium aluminum (TiAl). The channel layer 32 may be directly formed over the lower metal layer 31. The channel layer 32 may include an oxide semiconductor material. For example, the channel layer 32 may include at least one of InGaZnO, InGaZnSnO, InSnO, InSnZnO, SiInGaZnO, SiInGaZnSnO, SiInSnO, SiInSnZnO, AlGaZnO, AlGaZnSnO, AlSnO, AlSnZnO, SiAlGaZnO, SiAlGaZnSnO, SiAlSnO, SiAlSnZnO, InGaMgO, InGaMgSnO, InSnMgO, SiInGaMgO, SiInGaMgSnO, SiInSnMgO, AlGaMgO, AlGaMgSnO, AlSnMgO, SiAlGaMgO, SiAlGaMgSnO, SiAlSnMgO, or other oxide-based semiconductor materials. The buffer insulating layer 33 may be formed over the channel layer 32. The buffer insulating layer 33 may include silicon oxide ($SiO_2$) or aluminum oxide ($Al_2O_3$). A portion of the buffer insulating layer 33 may be removed so that the channel layer 32 and the lower source/drain contact pattern 61 can be in contact with each other in the contact area CA.

The gate pattern 50 may surround the upper surface and the side surfaces of the fin-type insulating pattern 20 and extend in the second horizontal direction Y in the gate area GA. The gate pattern 50 may be formed over the buffer insulating layer 33 in the gate area GA. The gate pattern 50 may include a gate insulating layer 52 and a gate electrode 55. In an embodiment, the gate insulating layer 52 may be formed to contact at least partially with an upper surface of the buffer insulating layer 33. The gate electrode 55 may be formed over the gate insulating layer 52. The gate insulating layer 52 may include at least one of a compound containing hafnium (Hf), such as hafnium oxide (HfO), hafnium oxy-nitride (HfON), hafnium silicon oxy-nitride (HfSiON), hafnium aluminum oxide (HfAlO), or hafnium aluminum oxide nitride (HfAlON), or compounds containing lanthanum (La), erbium (Er), strontium (Sr), barium (Ba), or zirconium (Zr). The gate electrode 55 may include at least one of polycrystalline silicon, a silicide, a metal, a metal alloy, and a metal compound. In an embodiment, a barrier metal layer may be further formed between the gate insulating layer 52 and the gate electrode 55. For example, the barrier metal layer may include at least one of titanium (Ti), titanium nitride (TiN), tantalum (Ta), tantalum nitride (TaN), and tungsten nitride (WN).

The insulating layers 41, 42, 43, and 44 may include a lower interlayer insulating layer 41, a capping insulating layer 42, a middle interlayer insulating layer 43, and an upper interlayer insulating layer 44. The lower interlayer insulating layer 41 may be formed over the buried insulating layer 15 to surround the lower source/drain contact pattern 61 and the gate pattern 50. The capping insulating layer 42 may be formed over an upper surface of the lower interlayer insulating layer 41 and an upper surface of the gate electrode 55. The upper interlayer insulating layer 44 may be formed over the capping insulating layer 42 to surround the upper source/drain contact pattern 62 and the gate contact pattern 63. The lower interlayer insulating layer 41 and the upper interlayer insulating layer 44 may include a silicon oxide-based insulating material such as silicon oxide (SiO$_2$), silicon hydro-oxide (SiHO), silicon oxy-carbide (SiOC), or silicon hydro-oxy-carbide (SiHOC). The capping insulating layer 42 may include an insulating material that is denser and harder than the lower interlayer insulating layer 41 and the upper interlayer insulating layer 44. For example, the capping insulating layer 42 may include silicon nitride (SiN).

The lower source/drain contact pattern 61 may have a wall shape in which a width in the second horizontal direction Y is several times greater than a width in the first horizontal direction X, and the upper source/drain contact pattern 62 may have a pillar shape in which a width in the second horizontal direction Y and a width in the first horizontal direction X are similar. The lower source/drain contact pattern 61 may include a lower source/drain contact barrier layer 61a and a lower source/drain contact plug 61b. The lower source/drain contact barrier layer 61a may surround a side surface of the lower source/drain contact plug 61b. The lower source/drain contact barrier layer 61a may be in contact with the channel layer 32. The lower source/drain contact barrier layer 61a may include titanium (Ti). For example, the lower source/drain contact barrier layer 61a may include at least one of titanium (Ti), titanium nitride (TiN), titanium carbide (TiC), titanium aluminum (TiAl), titanium aluminum nitride (TiAlN), tantalum (Ta), tantalum nitride (TaN), and tungsten nitride (WN). The lower source/drain contact plug 61b may include at least one of polycrystalline silicon, a silicide, a metal, a metal alloy, or a metal compound. The upper source/drain contact pattern 62 may include an upper source/drain contact barrier layer 62a and an upper source/drain contact plug 62b. The upper source/drain contact barrier layer 62a may be in contact with the lower source/drain contact plug 62b. The upper source/drain contact barrier layer 62a may cover the lower surface and side surfaces of the upper source/drain contact plug 62b. The upper source/drain contact barrier layer 62a may include a barrier metal such as titanium (Ti), titanium nitride (TiN), tantalum (Ta), tantalum nitride (TaN), or tungsten nitride (WN). The upper source/drain contact plug 62b may include at least one of polycrystalline silicon, a silicide, a metal, a metal alloy, or a metal compound.

The gate contact pattern 63 may be connected with the gate electrode 55. The gate contact pattern 63 may have a pillar shape. The gate contact pattern 63 may include a gate contact barrier layer 63a and a gate contact plug 63b. The gate contact barrier layer 63a may cover the lower surface and the side surfaces of the gate contact plug 63b. The gate contact barrier layer 63a may include a barrier metal such as titanium (Ti), titanium nitride (TiN), tantalum (Ta), tantalum nitride (TaN), or tungsten nitride (WN). The gate contact plug 63b may include at least one of polycrystalline silicon, a silicide, a metal, a metal alloy, and a metal compound.

FIGS. 3A to 3C are longitudinal sectional views taken along the lines I-I', II-II', and III-III' of a semiconductor device according to an embodiment of the present disclosure illustrated in FIG. 1, respectively. Referring to FIGS. 3A to 3C, a semiconductor device according to an embodiment of the present disclosure may further include an interfacial insulating layer 51 formed between the channel layer 32 and the gate insulating layer 52 as compared to the semiconductor device described with reference to FIGS. 2A to 2C. In the semiconductor device illustrated in FIGS. 2A to 2C, the interfacial insulating layer 51 may replace the buffer insulating layer 33 between the lower metal layer 31 and the gate insulating layer 52 in the gate region GA. That is, the interfacial insulating layer 51 may be formed in a region from which the buffer insulating layer 33 is removed. The interfacial insulating layer 51 may include aluminum oxide (Al$_2$O$_3$). The buffer insulating layer 33 may include silicon oxide (SiO$_2$). Reference numerals not described may be understood with reference to FIGS. 2A to 2C.

Figure 4C:
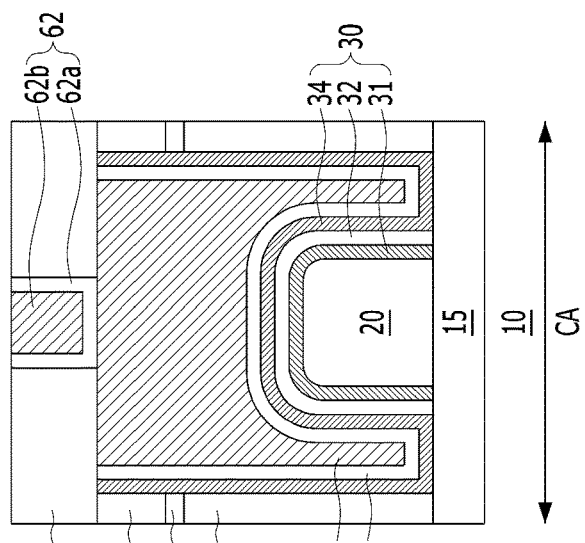
FIGS. 4A to 4C are longitudinal sectional views taken along the lines I-I', II-II', and III-III' of a semiconductor device according to an embodiment of the present disclosure illustrated in FIG. 1, respectively.
Figure 4B:
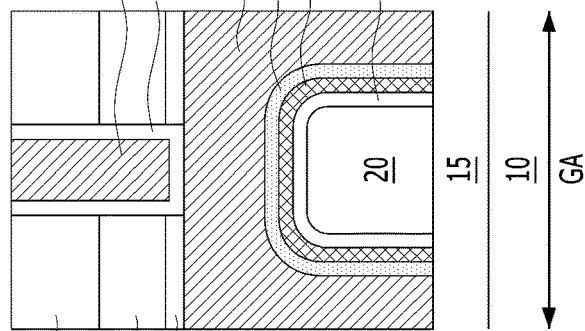
Figure 4A:
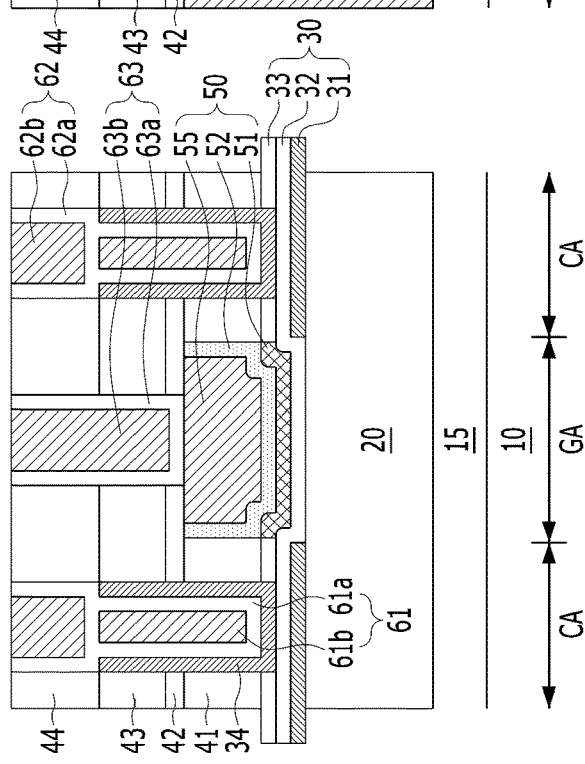

FIGS. 4A to 4C are longitudinal sectional views taken along the lines I-I', II-II', and III-III' of a semiconductor device according to an embodiment of the present disclosure illustrated in FIG. 1, respectively. Referring to FIGS. 4A to 4C, a semiconductor device according to an embodiment of the present disclosure may further include an upper metal layer 34 surrounding the lower surface and the side surfaces of the contact pattern 61 as compared to the semiconductor device described with reference to FIGS. 2A to 2C and the semiconductor device described with reference to FIGS. 3A to 3C. The upper metal layer 34 may be formed to surround a portion of the upper surface and the side surfaces of the channel layer 32 and the upper surface of the buried insulating layer 15 in the contact area CA. The upper metal layer 34 may be spaced apart from the gate pattern 50 in a horizontal direction. Accordingly, parasitic capacitance between the lower source/drain contact pattern 61 and the gate pattern 50 by the upper metal layer 34 may be reduced. The upper metal layer 34 may include at least one of titanium (Ti), titanium nitride (TiN), titanium carbide (TiC), titanium aluminum (TiAl), and titanium aluminum nitride (TiAlN). In an embodiment, the upper metal layer 34 may include one of titanium carbide (TiC) or titanium aluminum (TiAl). For example, the lower metal layer 31 and the upper metal layer 34 may be formed of the same material. Reference numerals not described with respect to FIGS. 4A to 4C may be understood with reference to FIGS. 2A to 2C and 3A to 3C.

The semiconductor devices according to the embodiments of the present disclosure may have a multi-channel structure having a three-dimensional structure covering the side surfaces and the upper surface of the fin-type insulating pattern 20. Accordingly, the driving capability of the transistor can be improved.

The oxide semiconductor materials have lower carrier mobility than intrinsic silicon. Therefore, when the oxide semiconductor materials are used as the channel material of the transistor, the off-current of the transistor can be lowered. However, the oxide semiconductor materials have high resistance due to low carrier concentration and the carrier mobility. The semiconductor device according to the present embodiment may include the lower metal layer 31 disposed below the channel layer 32 including the oxide semiconductor material. The lower metal layer 31 may include the Ti-based metal layer. The Ti-based metal layer may provide oxygen vacancy to the oxide semiconductor material by a scavenging phenomenon. The oxygen vacancy can increase a carrier concentration. Accordingly, the electrical resistance of the channel layer 32 corresponding to the source/drain can decrease and the conductivity can increase.

The semiconductor devices according to the present embodiments may further include the upper metal layer 34 including the Ti-based metal. Accordingly, the conductivity of the oxide semiconductor channel layer 32 can be more improved. In addition, the contact resistance between the channel layer 32 and the lower source/drain contact pattern 61 can be reduced.

FIGS. 5A to 12C are longitudinal sectional views illustrating a method of manufacturing a semiconductor device according to an embodiment of the present disclosure. FIGS. 5A to 12A are longitudinal sectional views taken along the line I-I' in FIG. 1, FIGS. 5B to 12B are longitudinal sectional views taken along the line II-II' in FIG. 1, and FIGS. 5C to 12C are longitudinal sectional views taken along the line III-III' in FIG. 1.

Figure 5A:
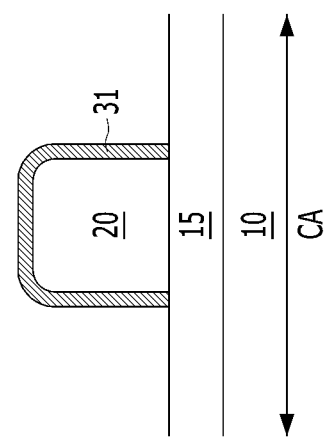
Figure 5B:
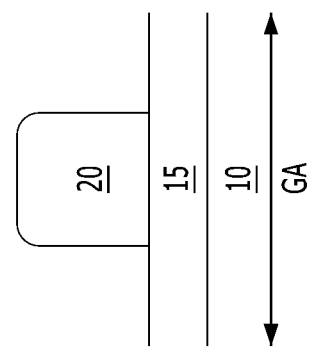
Figure 5C:
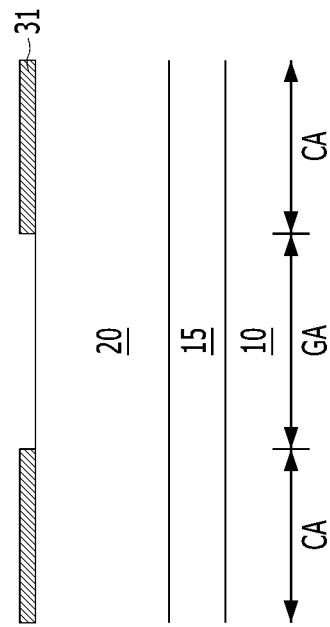

Referring to FIGS. 5A to 5C, the method of manufacturing a semiconductor device according to an embodiment of the present disclosure may include forming a buried insulating layer 15 over a substrate 10, forming a fin-type insulating pattern 20 over the buried insulating layer 15, and forming a lower metal layer 31 over the fin-type insulating pattern 20.

The substrate 10 may include a semiconducting layer such as a silicon wafer. The substrate 10 may have a gate area GA and a contact area CA.

Forming the buried insulating layer 15 may include entirely forming an insulating material such as silicon oxide ($SiO_2$) over the substrate 10 by performing a deposition process. In an embodiment, the buried insulating layer 15 may include multiple insulating layers.

Forming the fin-type insulating pattern 20 may include forming an insulating material such as silicon oxide ($SiO_2$) to have a fin shape or a bar shape extending in the first horizontal direction X by performing a deposition process, a photolithography process, and an etching process.

Forming the lower metal layer 31 may include forming a Ti-based metal layer to cover the fin-type insulating pattern 20 in the contact area CA by performing a deposition process and a patterning process. The Ti-based metal layer may include at least one of titanium (Ti), titanium nitride (TiN), titanium carbide (TiC), or titanium aluminum (TiAl). The lower metal layer 31 may cover the side surfaces and the upper surface of the fin-type insulating pattern 20 in the contact area CA in a pad form. In an embodiment, the lower metal layer 31 may partially extend onto the upper surface of the buried insulating pattern 20 in the contact area CA. In the gate area GA, the lower metal layer 31 may not cover the fin-type insulating pattern 20. That is, the lower metal layer 31 may not be formed in the gate area GA.

Referring to FIGS. 6A to 6C, the method may include forming a channel layer 32 over the lower metal layer 31 and the exposed fin-type insulating pattern 20, and forming a buffer insulating layer 33 over the channel layer 32. Forming the channel layer 32 may include entirely forming an oxide semiconductor material by performing a deposition process. The oxide semiconductor material may include indium (In), gallium (Ga), and zinc (Zn). For example, the oxide semiconductor material may include at least one of InGaZnO, InGaZnSnO, InSnO, InSnZnO, SiInGaZnO, SiInGaZnSnO, SiInSnO, SiInSnZnO, AlGaZnO, AlGaZnSnO, AlSnO, AlSnZnO, SiAlGaZnO, SiAlGaZnSnO, SiAlSnO, SiAlSnZnO, InGaMgO, InGaMgSnO, InSnMgO, SiInGaMgO, SiInGaMgSnO, SiInSnMgO, AlGaMgO, AlGaMgSnO, AlSnMgO, SiAlGaMgO, SiAlGaMgSnO, SiAlSnMgO, or other oxide-based semiconductor materials. Forming the buffer insulating layer 33 may include entirely forming an insulating material such as silicon oxide ($SiO_2$) or aluminum oxide ($Al_2O_3$) over the channel layer 32 by performing a deposition process. In an embodiment, the channel layer 32 and the buffer insulating layer 33 may be formed to partially extend onto the upper surface of the buried insulating pattern 20, respectively. The method may further include removing the channel layer 32 and the buffer insulating layer 33 over the buried insulating layer 15 by performing a patterning process. In an embodiment, the channel layer 32 and the buffer insulating layer 33 may not be removed and may partially remain over the buried insulating layer 15.

Figure 7A:
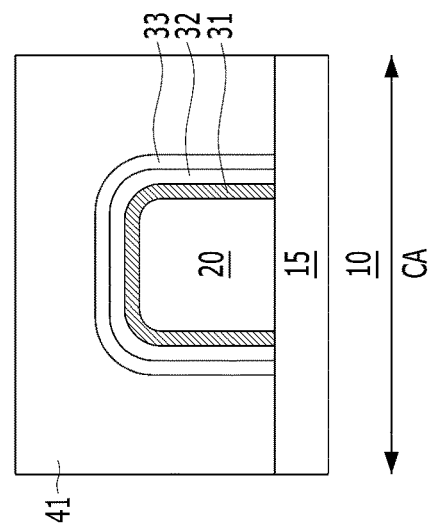
Figure 7B:
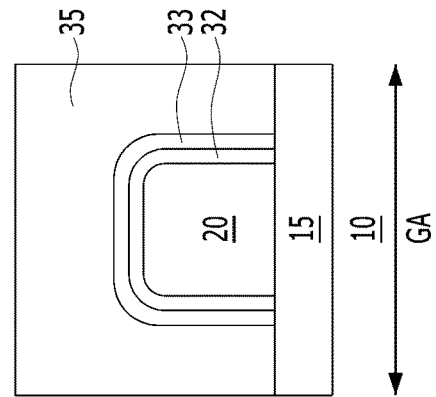
Figure 7C:
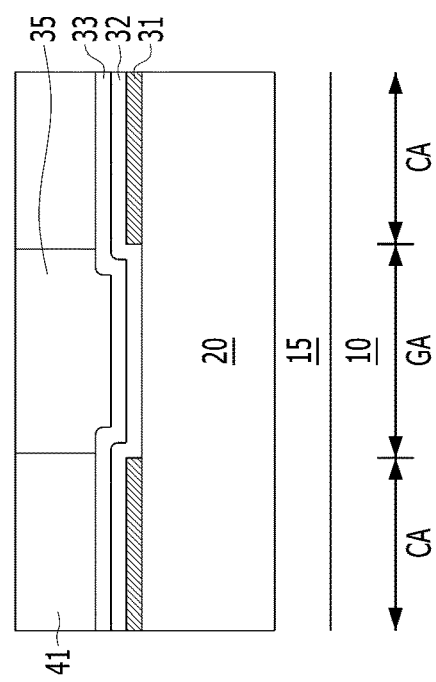

Referring to FIGS. 7A to 7C, the method may further include forming a sacrificial gate electrode 35 and a lower interlayer insulating layer 41. Forming the sacrificial gate electrode 35 may include forming polycrystalline silicon over the buffer insulating layer 33 and the buried insulating layer 15 in the gate area GA by performing a deposition process and a patterning process. Forming the lower interlayer insulating layer 41 may include entirely forming an insulating material such as silicon oxide ($SiO_2$) or silicon oxy-carbide (SiOC) by performing a deposition process, and planarizing the insulating material by performing a planarization process such as chemical-mechanical polishing (CMP). By the planarization process, the upper surface of the sacrificial gate electrode 35 and the upper surface of the lower interlayer insulating layer 41 may be coplanar.

Figure 8C:
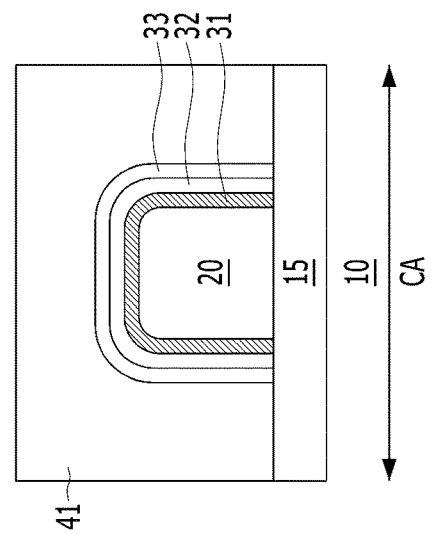
Figure 8B:
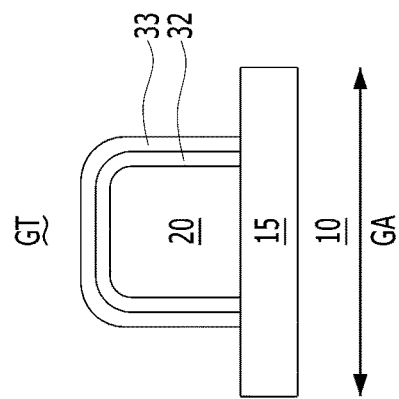
Figure 8A:
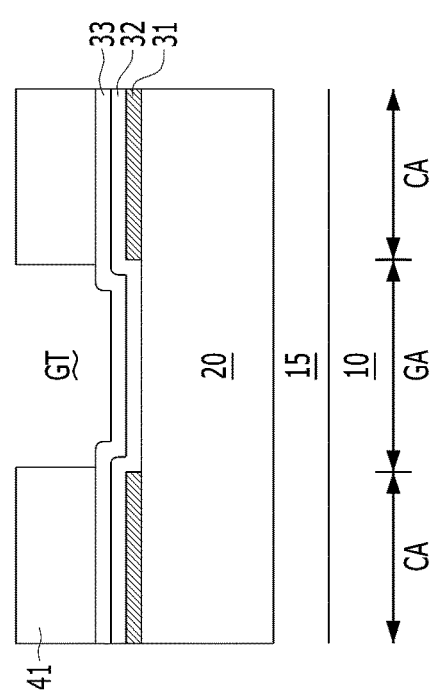

Referring to FIGS. 8A to 8C, the method may further include forming a gate trench GT in the gate area GA by removing the sacrificial gate electrode 35. The buffer insulating layer 33 and the buried insulating layer 15 may be exposed in the gate trench GT.

Referring to FIGS. 9A to 9C, the method may further include forming a gate insulating layer 52 and a gate electrode 55 in the gate trench GT. Forming the gate insulating layer 52 may include conformally forming a high-k material over the bottom and inner walls of the gate trench GT by performing a deposition process.

The gate insulating layer 52 may include at least one of a compound containing hafnium (Hf), such as hafnium oxide (HfO), hafnium oxy-nitride (HfON), hafnium silicon oxy-nitride (HfSiON), hafnium aluminum oxide (HfAlO), or hafnium aluminum oxy-nitride (HfAlON), or compounds containing lanthanum (La), erbium (Er), strontium (Sr), barium (Ba), or zirconium (Zr). The gate electrode 55 may include polycrystalline silicon, a silicide, a metal, a metal alloy, or a metal compound. The method may further include co-planarizing the upper surface of the lower interlayer insulating layer 41, the upper surface of the gate insulating layer 52, and the upper surface of the gate electrode 55 by performing a planarization process such as CMP.

Referring to FIGS. 10A to 10C, the method may further include forming a capping insulating layer 42 over the lower interlayer insulating layer 41 and the gate electrode 55, forming a middle interlayer insulating layer 43 over the capping insulating layer 42, and forming a lower source/drain contact slit CS exposing the channel layer 32 in the contact area CA. Forming the capping insulating layer 42 may include entirely forming a denser and harder material than the lower interlayer insulating layer 41 by performing a deposition process. The capping insulating layer 42 may include a barrier insulating material that prevents a reaction between the gate electrode 55 and the upper interlayer insulating layer 44. For example, the capping insulating layer 42 may include silicon nitride (SiN). Forming the middle interlayer insulating layer 43 may include forming an insulating material such as silicon oxide ($SiO_2$) or silicon oxy-carbide (SiOC) over the capping insulating layer 42 by performing a deposition process. Forming the lower source/drain contact slit CS may include selectively etching the middle interlayer insulating layer 43, the capping insulating layer 42, and the lower interlayer insulating layer 41 to expose the buffer insulating layer 33, and removing the exposed buffer insulating layer 33 to expose the channel layer 32. The lower source/drain contact slit CS may be spaced apart from the gate electrode 55 in a horizontal direction. The lower source/drain contact slit CS may expose the surface of the channel layer 32 formed over the sidewall of the fin-type insulating pattern 20 and expose the upper surface of the buried insulating layer 15.

Figure 11C:
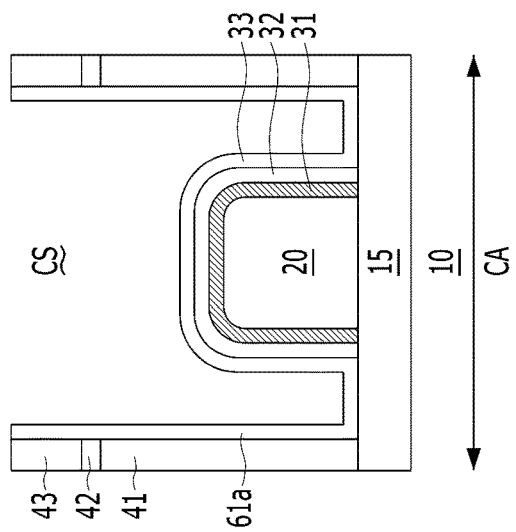
Figure 11B:
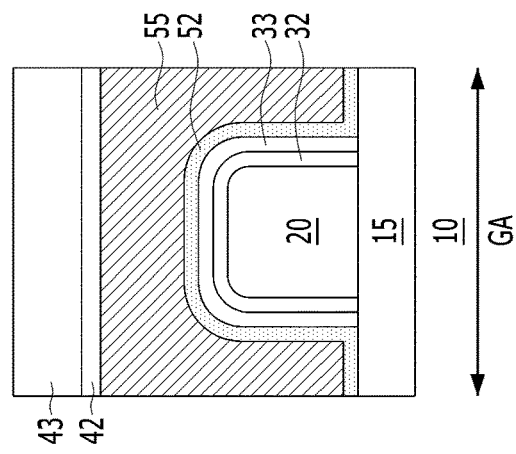
Figure 11A:
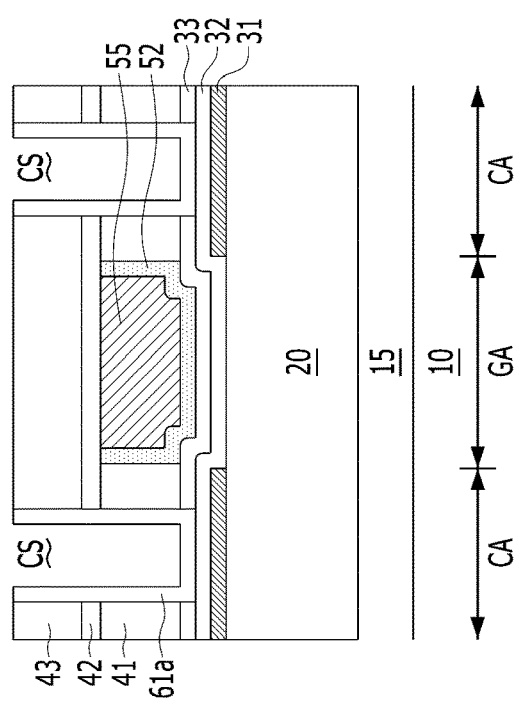

Referring to FIGS. 11A to 11C, the method may further include forming a lower source/drain contact barrier layer 61a in the lower source/drain contact slit CS. Forming the lower source/drain contact barrier layer 61a may include conformally forming a metal layer including titanium (Ti) over inner walls and a bottom surface of the lower source/drain contact slit CS by performing a deposition process. Accordingly, the lower source/drain contact barrier layer 61a may be directly formed over the channel layer 32 exposed in the lower source/drain contact slit CS. For example, the lower source/drain contact barrier layer 61a may include at least one of titanium (Ti), titanium nitride (TiN), titanium carbide (TiC), titanium aluminum (TiAl), or titanium aluminum nitride (TiAlN). In an embodiment, the lower source/drain contact barrier layer 61a may include at least one of titanium (Ti), titanium nitride (TiN), tantalum (Ta), tantalum nitride (TaN), tungsten nitride (WN), or other barrier metals.

Figure 12C:
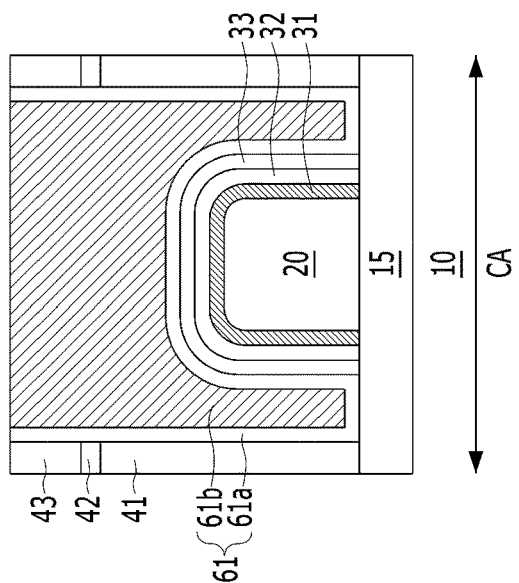
Figure 12B:
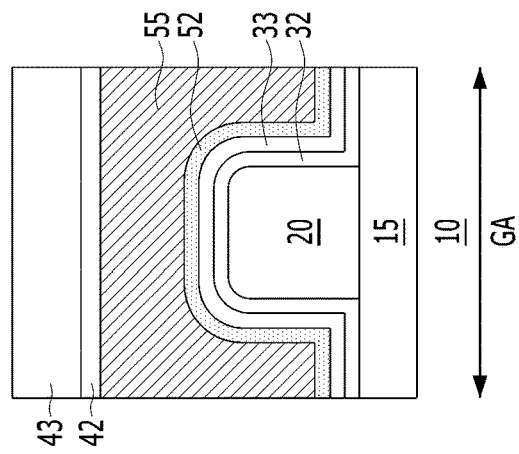
Figure 12A:
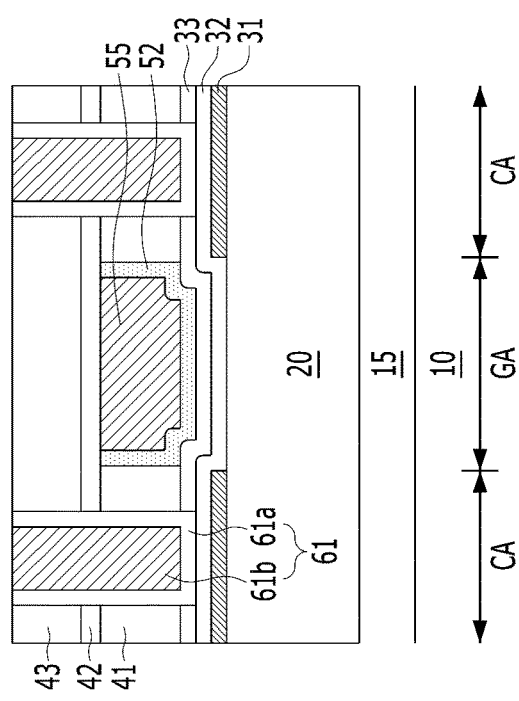

Referring to FIGS. 12A to 12C, the method may further include forming a lower source/drain contact plug 61b by filling the lower source/drain contact slit CS with a conductive material. The lower source/drain contact plug 61b may include a metal such as tungsten (W). The method may further include co-planarizing an upper surface of the lower source/drain contact plug 61b and an upper surface of the middle interlayer insulating layer 43 by performing a planarization process such as CMP.

Thereafter, the method may include forming an upper interlayer insulating layer 44, and forming an upper source/drain contact pattern 62 and a gate contact pattern 63 with further reference to FIGS. 2A to 2C. Forming the upper interlayer insulating layer 44 may include forming an insulating material such as silicon oxide ($SiO_2$) or silicon oxy-carbide (SiOC) by performing a deposition process. Forming the upper source/drain contact pattern 62 may include performing an etching process to form a hole that vertically penetrates the upper interlayer insulating layer 44 to expose the upper surface of the lower source/drain contact pattern 61, performing a deposition process to conformally form an upper source/drain contact barrier layer 62a over an inner wall and a bottom surface the hole, and performing a filling process to form an upper source/drain contact plug 62b that fills the hole. Forming the gate contact pattern 63 may include forming a hole that vertically penetrates the upper interlayer insulating layer 44 to expose the gate electrode 55 by performing an etching process, conformally forming a gate contact barrier layer 63a over an inner wall and a bottom surface of the hole by performing a deposition process, and forming a gate contact plug 63b that fills the hole by performing a filling process. The upper source/drain contact barrier layer 62a and gate contact barrier layer 63a may include at least one of titanium (Ti), titanium nitride (TiN), tantalum (Ta), tantalum nitride (TaN), tungsten nitride (WN), and other barrier metals. The upper source/drain contact plug 62b and the gate contact plug 63b may include a metal such as tungsten (W).

Figure 13C:
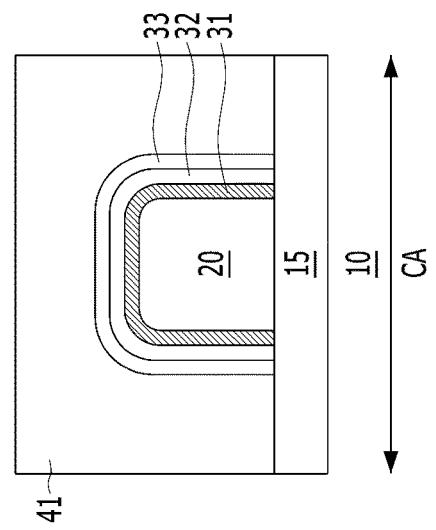
FIGS. 13A to 14C are longitudinal sectional views illustrating a method of manufacturing a semiconductor device according to an embodiment of the present disclosure.
Figure 13B:
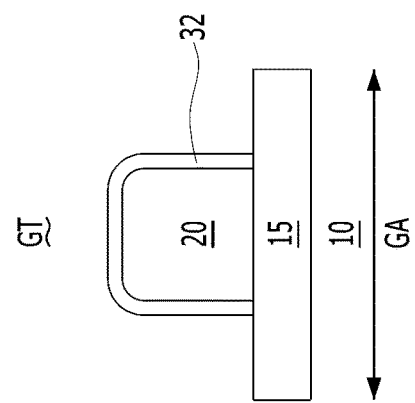
Figure 13A:
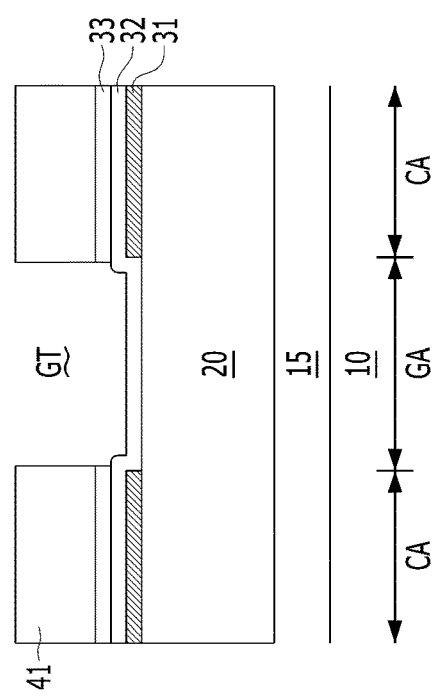
Figure 14C:
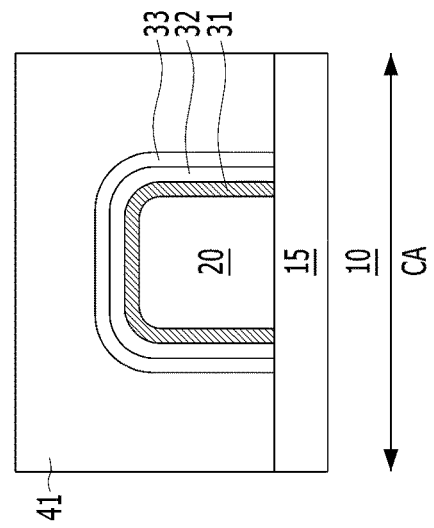

FIGS. 13A to 14C are longitudinal sectional views illustrating a method of manufacturing a semiconductor device according to an embodiment of the present disclosure. FIGS. 13A and 14A are longitudinal sectional views taken along the line I-I' of FIG. 1, FIGS. 13B and 14B are longitudinal sectional views taken along the line II-II' of FIG. 1, and FIGS. 13C and 14C are longitudinal sectional views taken along the line III-III' of FIG. 1.

Referring to FIGS. 13A to 13C, the method of manufacturing a semiconductor device according to an embodiment of the present disclosure may include performing the processes described with reference to FIGS. 5A to 8C, and exposing the channel layer 32 in the gate trench GT by removing the buffer insulating layer 33 exposed in the gate trench GT.

Figure 14B:
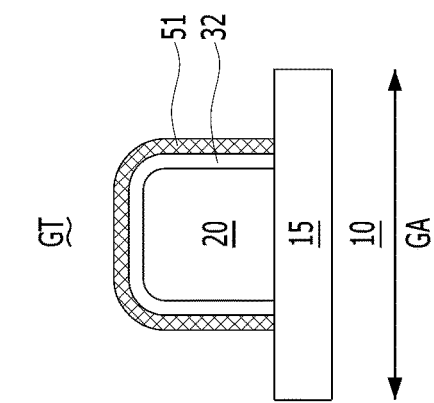
Figure 14A:
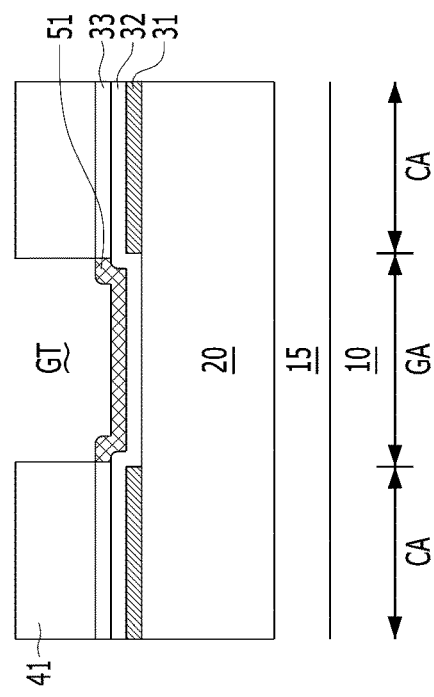

Referring to FIGS. 14A to 14C, the method may further include forming an interfacial insulating layer 51 over the exposed channel layer 32. The interfacial insulating layer 51 may include at least one of silicon oxide ($SiO_2$), aluminum oxide ($Al_2O_3$), or other insulating material. In an embodiment, the interfacial insulating layer 51 may extend onto the buried insulating layer 15.

Thereafter, the method further includes performing the processes described with reference to FIGS. 9A to 12C, and forming an upper interlayer insulating layer 44 with reference to FIGS. 3A to 3C, and forming an upper source/drain contact pattern 62 and a gate contact pattern 63.

FIGS. 15A to 15C are longitudinal sectional views illustrating a method of manufacturing a semiconductor device according to an embodiment of the present disclosure. FIG. 15A is a longitudinal sectional view taken along the line I-I' of FIG. 1, FIG. 15B is a longitudinal sectional view taken along the line II-II' of FIG. 1, and FIG. 15C is a longitudinal sectional view taken along the line III-III' of FIG. 1. Referring to FIGS. 15A to 15C, a method of manufacturing a semiconductor device according to an embodiment of the present disclosure may include performing the processes described with reference to FIGS. 5A to 10C, and forming an upper metal layer 34 over a bottom surface of the lower source/drain contact slit CS. The upper metal layer 34 may be formed over the channel layer 32 and the buried insulating layer 15 exposed by the lower source/drain contact slit CS. The upper metal layer 34 may also be conformally formed over inner walls of the lower source/drain contact slit CS.

Thereafter, the method further include performing the processes described with reference to FIGS. 11A to 12C, forming an upper interlayer insulating layer 44 with reference to FIGS. 4A to 4C, and forming an upper source/drain contact pattern 62 and a gate contact pattern 63.

According to embodiments of the present disclosure, a semiconductor device can include a transistor having a multi-oxide semiconductor channel. Since the transistor has an oxide semiconductor channel, the transistor can have a low off-current characteristic. Since the transistor has multiple channels, the transistor can have excellent driving capability. The resistance of the oxide semiconductor channel scavenged by the Ti-based metal may be lowered. Accordingly, the resistance of the source/drain contact may be lowered.

Although the present invention has been specifically described according to the above-described preferred embodiments, it should be noted that the above-described embodiments are for the purpose of explanation and not for the limitation thereof. In addition, it will be appreciated by person having ordinary skill in the art that various embodiments are possible within the scope of the present invention.

What is claimed is:

1. A semiconductor device comprising:
   a substrate having a gate area and a contact area;
   a buried insulating layer formed over the substrate;
   a fin-type insulating pattern formed over the buried insulating layer and extending in a first horizontal direction;
   a lower metal layer covering an upper surface and side surfaces of the fin-type insulating pattern in the contact area;
   a channel layer covering an upper surface and side surfaces of the lower metal layer in the contact area and covering the upper surface and the side surfaces of the fin-type insulating pattern in the gate area;
   a gate pattern disposed over the channel layer in the gate area and extending in a second horizontal direction; and
   a source/drain contact pattern disposed over the channel layer in the contact area,
   wherein:
   the lower metal layer includes a Ti-based metal, and
   the channel layer includes an oxide semiconductor material.

2. The semiconductor device of claim 1, wherein the Ti-based metal includes at least one of TiC or TiAl.

3. The semiconductor device of claim 1,
   wherein the gate pattern includes: an interfacial insulating layer;
   a gate insulating layer over the interfacial insulating layer; and
   a gate electrode over the gate insulating layer.

4. The semiconductor device of claim 1, further comprising:
   an upper metal layer disposed between the channel layer and the source/drain contact pattern and horizontally spaced apart from the gate pattern in the contact area,
   wherein the upper metal layer includes the Ti-based metal.

5. The semiconductor device of claim 4, wherein the upper metal layer surrounds an upper side and side surface of the channel layer, a portion of an upper surface of the buried insulating layer, and a lower surface and side surfaces of the source/drain contact pattern.

6. The semiconductor device of claim 5, wherein:
   the source/drain contact pattern includes a source/drain contact barrier layer and a source/drain contact plug, and
   the source/drain contact barrier layer surrounds a bottom surface and side surfaces of the source/drain contact plug.

7. The semiconductor device of claim 5, wherein:
   the source/drain contact pattern includes a lower source/drain contact pattern and an upper source/drain pattern, and
   a width of the lower source/drain contact pattern in the second horizontal direction is greater than a width of the lower source/drain contact pattern in the first horizontal direction.

8. The semiconductor device of claim 1, further comprising:
   a buffer insulating layer over the channel layer; and
   a lower interlayer insulating layer over the buffer insulating layer, the lower interlayer insulating layer surrounding side surfaces of the source/drain contact pattern,
   wherein:
   the buffer insulating layer includes silicon oxide or aluminum oxide, and
   the lower interlayer insulating layer includes silicon oxide or silicon oxy-carbide.

9. The semiconductor device of claim 1, wherein the first horizontal direction is perpendicular to the second horizontal direction.

10. A semiconductor device comprising:
    a substrate having a gate area and a contact area;
    a fin-type insulating pattern extending in a first horizontal direction over the substrate;
    a lower Ti-based metal layer covering an upper surface and side surfaces of the fin-type insulating pattern in the contact area;
    an oxide semiconductor layer covering an upper surface and side surfaces of the lower Ti-based metal layer in the contact area and covering the upper surface and the side surfaces of the fin-type insulating pattern in the gate area;
    a buffer insulating layer over the oxide semiconductor layer;
    a gate pattern extending in a second horizontal direction over the oxide semiconductor layer in the gate area; and
    a source/drain contact pattern over the oxide semiconductor layer in the contact area.

11. The semiconductor device of claim 10, wherein the gate pattern penetrates the buffer insulating layer to be in direct contact with the oxide semiconductor layer.

12. The semiconductor device of claim 11,
    wherein the buffer insulating layer includes silicon oxide,
    wherein the gate pattern includes:
    an interfacial insulating layer;
    a gate insulating layer over the interfacial insulating layer; and
    a gate electrode over the gate insulating layer, and
    wherein the interfacial insulating layer includes aluminum oxide.

13. The semiconductor device of claim 10, wherein the source/drain contact pattern penetrates the buffer insulating layer to be in direct contact with the oxide semiconductor layer.

14. The semiconductor device of claim 10, wherein:
    the source/drain contact pattern includes a source/drain contact barrier layer and a source/drain contact plug, and
    the source/drain contact barrier layer surrounds a bottom surface and side surfaces of the source/drain contact plug.

15. The semiconductor device of claim 10, further comprising:
   an upper Ti-based metal layer between the oxide semiconductor layer and the source/drain contact pattern.

16. The semiconductor device of claim 15, wherein the upper Ti-based metal layer surrounds a bottom surface and side surfaces of the source/drain contact pattern.

17. The semiconductor device of claim 10, wherein the first horizontal direction is perpendicular to the second horizontal direction.

18. A semiconductor device comprising:
   a substrate having a gate area and a contact area;
   a buried insulating layer over the substrate;
   a fin-type insulating pattern over the buried insulating layer, the fin-type insulating pattern extending in a first horizontal direction and formed in the gate area and the contact area;
   a lower Ti-based metal layer over an upper surface and side surfaces of the fin-type insulating pattern in the contact area;
   a channel layer formed over the fin-type insulating pattern in the gate area and formed over the lower Ti-based metal layer in the contact area;
   a gate electrode extending in a second horizontal direction and formed over the channel layer in the gate area;
   an upper Ti-based metal layer over the channel layer in the contact area; and
   a source/drain contact pattern over the upper Ti-based metal layer in the contact area.

19. The semiconductor device of claim 18, wherein the lower Ti-based metal layer includes one of TiC or TiAl.

20. The semiconductor device of claim 18, wherein the upper Ti-based metal layer includes at least one of Ti, TiN, TiC, TiAl, and TiAlN.

21. The semiconductor device of claim 18, wherein the channel layer includes one oxide semiconductor material.

22. The semiconductor device of claim 18, wherein the upper Ti-based metal layer conformally covers an upper surface of the channel layer over an upper surface of the lower Ti-based metal layer over the upper surface of the fin-type insulating pattern, side surfaces of the channel layer over side surfaces of the lower Ti-based over the side surfaces of the fin-type insulating pattern, a portion of upper surfaces of the buried insulating layer, and a bottom surface and side surfaces of the source/drain contact pattern.

23. The semiconductor device of claim 18, wherein the first horizontal direction is perpendicular to the second horizontal direction.

* * * * *